United States Patent
Aihara

(10) Patent No.: US 10,416,552 B2
(45) Date of Patent: Sep. 17, 2019

(54) IMPRINTING METHOD AND IMPRINTING APPARATUS, SAMPLE SHOT EXTRACTION METHOD, AND ARTICLE MANUFACTURING METHOD USING SAME

(71) Applicant: CANON KABUSHIKI KAISHA, Tokyo (JP)

(72) Inventor: Sentaro Aihara, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 218 days.

(21) Appl. No.: 15/481,540

(22) Filed: Apr. 7, 2017

(65) Prior Publication Data

US 2017/0212419 A1 Jul. 27, 2017

Related U.S. Application Data

(63) Continuation of application No. 13/162,629, filed on Jun. 17, 2011, now Pat. No. 9,651,860.

(30) Foreign Application Priority Data

Jun. 17, 2010 (JP) .................................. 2010-138206

(51) Int. Cl.
*B29C 59/02* (2006.01)
*G03F 7/00* (2006.01)
(Continued)

(52) U.S. Cl.
CPC ............. *G03F 7/0002* (2013.01); *B05D 3/12* (2013.01); *B05D 7/26* (2013.01); *B82Y 10/00* (2013.01); *B82Y 40/00* (2013.01)

(58) Field of Classification Search
CPC ..................................................... B29C 59/02
(Continued)

(56) References Cited

U.S. PATENT DOCUMENTS 7,812,927 B2 10/2010 Kurosawa
7,862,761 B2 1/2011 Okushima et al.
(Continued)

FOREIGN PATENT DOCUMENTS

JP 2005129674 A 5/2005
JP 2007320098 A 12/2007
(Continued)

OTHER PUBLICATIONS

Office Action issued in Japanese Appln. No. 2010-138206 dated Dec. 22, 2014.
(Continued)

*Primary Examiner* — Christina A Johnson
*Assistant Examiner* — Xue H Liu
(74) *Attorney, Agent, or Firm* — Rossi, Kimms & McDowell LLP

(57) ABSTRACT

An imprinting method is capable of strictly interpolating application distribution of uncured resin material being applied to a substrate for each shot and interpolating application distribution of uncured resin material for each shot while reducing workload in a generation step. The imprinting apparatus includes a mold; a mold driving unit; a dispenser that applies uncured resin material to the substrate; a light source that cures uncured resin material as a pattern; a dispenser control unit that controls the dispenser by generating the application distribution of the uncured resin material to the resin pattern for each of a plurality of shots; and a main control unit that interpolates application distribution of uncured resin material, which has been generated by the dispenser control unit, using shot layout information of relative position among positions of a plurality of shots, the dispenser, and the light source with respect to the substrate, as variables.

7 Claims, 12 Drawing Sheets

(51) Int. Cl.
  *B82Y 10/00* (2011.01)
  *B82Y 40/00* (2011.01)
  *B05D 3/12* (2006.01)
  *B05D 7/26* (2006.01)

(58) Field of Classification Search
  USPC .................................................... 264/319
  See application file for complete search history.

(56) References Cited

U.S. PATENT DOCUMENTS

| | | |
|---|---|---|
| 8,019,462 B2 | 9/2011 | Yoneda et al. |
| 2007/0228593 A1 | 10/2007 | Jones et al. |
| 2007/0250290 A1 | 10/2007 | Kurosawa |
| 2007/0278712 A1 | 12/2007 | Okushima et al. |
| 2009/0267268 A1 | 10/2009 | Yoneda et al. |
| 2010/0078840 A1 | 4/2010 | Kawakami et al. |
| 2010/0098859 A1 | 4/2010 | Schumaker |

FOREIGN PATENT DOCUMENTS

| | | |
|---|---|---|
| JP | 2008502157 A | 1/2008 |
| JP | 2009088376 A | 4/2009 |
| WO | 2005120834 A2 | 12/2005 |

OTHER PUBLICATIONS

Office Action issued in Taiwanese Appin. No. 103132787 dated Jun. 16, 2015.
Office Action issued in U.S. Appl. No. 13/162,629 dated Jun. 19, 2013.
Office Action issued in U.S. Appl. No. 13/162,629 dated Mar. 4, 2014.
Office Action issued in U.S. Appl. No. 13/162,629 dated Oct. 3, 2014.
Office Action issued in U.S. Appl. No. 13/162,629 dated Jun. 19, 2015.
Office Action issued in U.S. Appl. No. 13/162,629 dated Mar. 15, 2016.
Notice of Allowance issued in U.S. Appl. No. 13/162,629 dated Jan. 13, 2017.

FIG. 8

| Feature | Feature element (Mold pattern) | Feature element (He flow rate) | Feature element (Distance from outer periphery of wafer) |
|---|---|---|---|
| A | TypeA | 5 | 1 |
| B | TypeA | 4 | 2 |
| C | TypeA | 3 | 2 |
| D | TypeA | 2 | 2 |
| E | TypeA | 1 | 2 |
| F | TypeA | 1 | 1 |
| G | TypeB | 1 | 2 |
| H | TypeB | 1 | 1 |

IMPRINTING METHOD AND IMPRINTING APPARATUS, SAMPLE SHOT EXTRACTION METHOD, AND ARTICLE MANUFACTURING METHOD USING SAME

BACKGROUND OF THE INVENTION

Field of the Invention

The present invention relates to an imprinting method and an imprinting apparatus that form a resin pattern from an uncured resin material applied to a substrate, a sample shot extraction method, and an article manufacturing method using the same.

Description of the Related Art

Conventionally, an imprinting technology in which a liquid uncured resin material is applied for each of a plurality of shots arranged on a substrate, and then the applied uncured resin material is formed into an application pattern by embossing to thereby form a resin pattern by curing has been known.

The imprinting technology is a technology that is capable of forming a resin pattern consisting of a nano-scale fine pattern, and is being practically implemented as one of the nano-lithography technologies for facilitating the mass production of magnetic storage media and semiconductor devices. Also, in the imprinting technology, a mold is employed on which a mold pattern (mold or template) that corresponds to the negative/positive inverted image of a resin pattern to be finally transferred to a substrate is formed using an electron beam lithography system or the like. A resin pattern is formed by applying an uncured resin material to a substrate such as a silicon substrate (wafer), glass plate, or the like, and curing the uncured resin material in a state in which the mold pattern is pressed against the uncured resin material so as to form an application pattern. At this time, the shape of a resin pattern to be formed on a substrate may differ depending on the type of device to be produced. Thus, the application distribution of an uncured resin material to be applied to a substrate also needs to be generated in accordance with the resin pattern. Accordingly, in general, the capacity and the application distribution of an uncured resin material to be applied to a substrate need to be calculated based on the volume of a resin pattern (for example, see Japanese Patent Laid-Open No. 2008-502157).

On the other hand, an uncured resin material applied to a substrate is exposed to the surrounding environment, such as air flow, in the liquid state until the uncured resin material is cured. Consequently, the state change, such as volatilization of an uncured resin material, may readily occur due to the influence of surrounding environment. Thus, in order to suppress the adverse effect of the state change, the degree of change due to surrounding environment needs to be predicted in advance. For example, when the height of the resin pattern formed on a substrate is measured and variations in height exist, a method for adjusting the application distribution of an uncured resin material in advance so as to suppress such variations has been proposed (for example, see U.S. Patent Publication No. 2007/0228593).

However, in the method for adjusting the application distribution of an uncured resin material as described above, only the height of a resin pattern and surrounding environment, such as air flow, are taken into consideration, and thus, the adjustment conditions are insufficient, whereby a sufficient adjustment result may not be obtained. Also, since the state change of a resin pattern varies from around the center of a substrate to around the periphery thereof for each shot, a uniform shot cannot be formed by the adjustment result in which the height of a resin pattern and surrounding environment, such as air flow, are simply taken into consideration. Furthermore, the adjustment for each substrate to be processed, in particular, for each shot is extremely difficult. Once the adjustment is made for the application distribution, such application distribution may be executed for the next substrate under the same condition. Therefore, the resin pattern accuracy of the entire substrate varies and remains low.

Accordingly, the present invention provides an imprinting method and an imprinting apparatus that are capable of strictly interpolating the application distribution of an uncured resin material for each shot, as well as reinterpolating the application distribution efficiently while reducing the workload of a user.

SUMMARY OF THE INVENTION

According to an aspect of the present invention, an imprinting method that forms a resin pattern on a plurality of shots arranged on a substrate is provided that includes: generating an application distribution of an uncured resin material onto the plurality of shots for each shot; interpolating the application distribution of the uncured resin material using shot layout information, which takes into account the relative positions among the positions of the plurality of shots, the supply position of the uncured resin material, and the curing position of the uncured resin material with respect to the substrate, as variables; applying an uncured resin material for each of the plurality of shots using the generated and interpolated application distribution; forming a predetermined application pattern from the uncured resin material applied to the substrate; and forming a resin pattern by curing the application pattern.

According to the present invention, the interpolation of the application distribution of an uncured resin material to be applied on a substrate can be strictly performed for each shot, and the application distribution of an uncured resin material can be efficiently reinterpolated for each shot while reducing the workload involved in a generation process.

Further features of the present invention will become apparent from the following description of exemplary embodiments with reference to the attached drawings.

BRIEF DESCRIPTION OF THE DRAWINGS

FIG. 8 is a table illustrating how features are applied to a rectangular region.

DESCRIPTION OF THE EMBODIMENTS

Hereinafter, an imprinting apparatus according to an embodiment of the present invention will now be described with reference to the accompanying drawings. The embodiments to be described below are preferred specific embodiments of the imprinting apparatus of the present invention. Although various limitations suitable for the technical configuration may be provided, the technical scope of the present invention may not be limited to these embodiments as long as there is no special description to limit the present invention. Also the components of the embodiments to be described below may be substituted for existing components as appropriate, and various variations in combinations of other existing components may be made. Therefore, the context of the present invention as defined in the appended claims is not be limited by the description of embodiments to be described below.

First Embodiment

Figure 1:
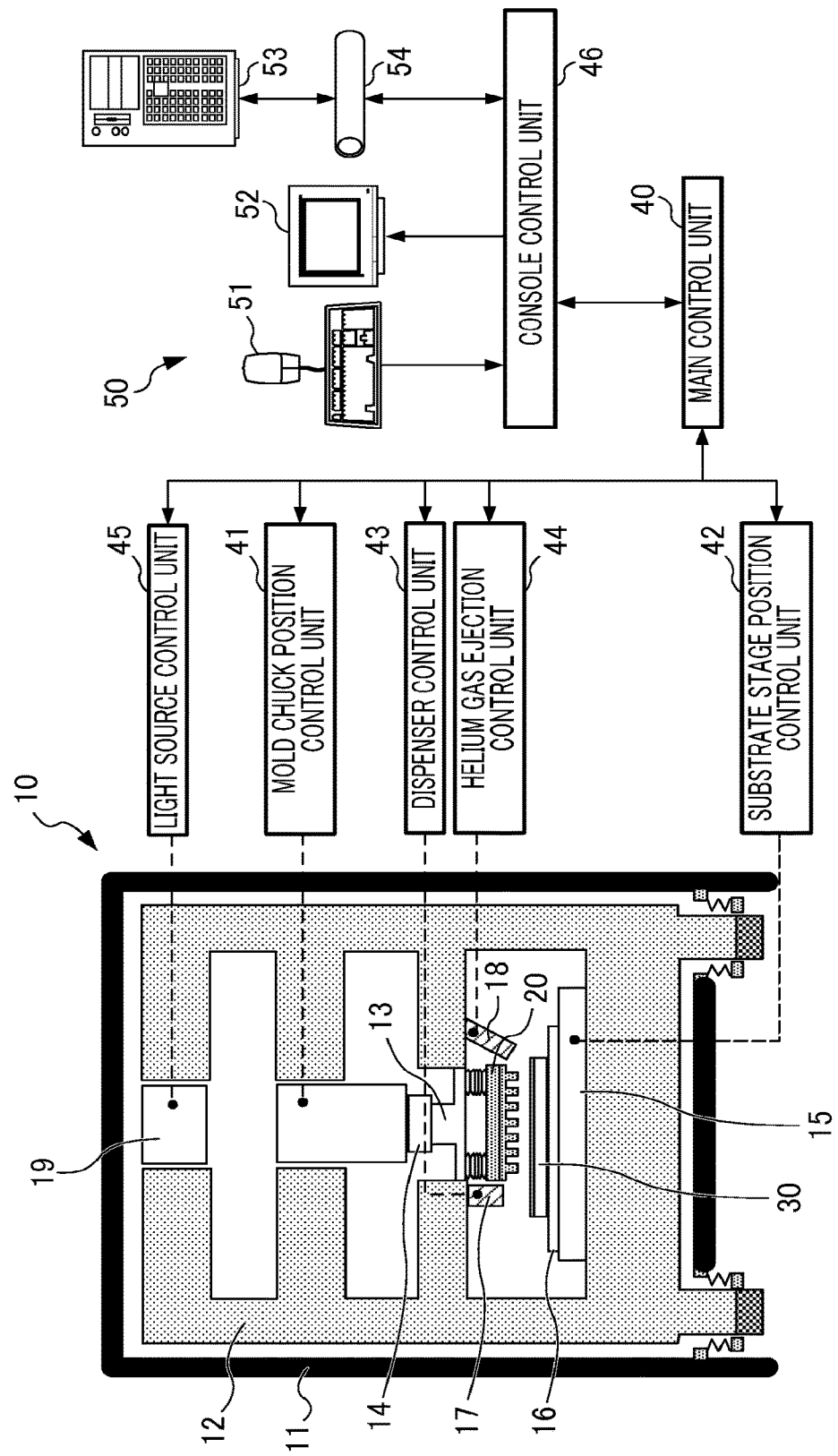
FIG. 1 is a diagram illustrating a schematic structure of an imprinting apparatus according to an embodiment of the present invention.

FIG. 1 is a diagram illustrating a schematic structure of an imprinting apparatus according to an embodiment of the present invention. In an imprinting apparatus 10 shown in FIG. 1, the entire interior of the apparatus is housed in a chamber 11 and is maintained in a certain atmosphere. Also, a base 12 consisting of high rigidity structure is arranged at the inner side of the chamber 11. In the base 12, a mold 20 serving as a pattern formation unit and a substrate 30 are arranged face-to-face in a highly accurate positioned state. The mold 20 is conveyed from outside the imprinting apparatus 10 to the mold chuck 13 by a mold conveyance system (not shown), and is supported by the mold chuck 13. Note that the mold chuck 13 is mounted on the base 12 via a mold driving unit 14 serving as a driving unit that is drivable in the Z, ωx, and ωy directions such that the mold chuck 13 is capable of movement toward and away from the substrate 30. Also, the substrate 30 is conveyed from outside the imprinting apparatus 10 to a substrate chuck 16 of a substrate stage 15 via a substrate conveyance system (not shown). The substrate stage 15 is drivable in the directions of the rotation (ωx, ωy, ωz) around the X-, Y-, and Z-axes. The substrate 30 supported by the substrate chuck 16 performs XY movement and position correction directly below the mold 20. Furthermore, a dispenser 17 serving as an uncured resin material supply unit, a helium gas injection unit 18 serving as a gas injection unit, and a light source 19 serving as an uncured resin material curing unit are arranged on the base 12.

The dispenser 17 is a resin supply mechanism that supplies a liquid uncured resin material such as a photocurable resin or the like to be used for a resist, and ejects an uncured resin material to the substrate 30. At this time, the dispenser 17 is mounted on a mold chuck 13 (or the base 12) such that an ejection nozzle (not shown) for the uncured resin material stands facing the substrate 30. The helium gas injection unit 18 ejects helium gas toward the uncured resin material that has been applied to the substrate 30. The ejected helium gas is dissolved into the uncured resin material. This brings out a beneficial effect that the time required for filling the grooves of the mold 20 (to be described below) with the uncured resin material can be shortened when the mold 20 is pressed against the uncured resin material to thereby form an application pattern. The light source 19 emits ultraviolet light for curing the uncured resin material applied to the substrate 30.

At the same time, the main control unit 40 serving as an interpolation control unit and a sample shot extraction unit controls a mold chuck position control unit 41, a substrate stage position control unit 42, a dispenser control unit 43 serving as an application distribution control unit, a helium gas ejection control unit 44, and a light source control unit 45. The mold chuck position control unit 41 drive-controls the mold driving unit 14 for driving the mold chuck 13 such that the mold 20 is moved toward and away from the substrate 30. The substrate stage position control unit 42 drive-controls the substrate stage 15. The dispenser control unit 43 ejects the uncured resin material toward the substrate 30 in accordance with the application distribution of the uncured resin material while synchronizing with the substrate stage position control unit 42. The helium gas ejection control unit 44 ejects helium gas toward the uncured resin material applied to the substrate 30. The light source control unit 45 controls the irradiation amount and the irradiation timing of the ultraviolet light emitted from the light source 19.

The main control unit 40 processes a processing request made from an operation unit 50 operated by a user via a console control unit 46. The operation unit 50 includes an input terminal 51, a monitor 52, a server 53, and a communication network 54. A processing request, which has been output from a user using the input terminal 51 and the monitor 52, is accepted by the console control unit 46. Then, the processing request is transferred from the console control unit 46 to the main control unit 40. The input terminal 51, the monitor 52, and the console control unit 46 configure a user interface for generating the application distribution of the uncured resin material for each of a plurality of shots. The server 53 communicates with the console control unit 46 via a communication network 62 such as LAN or the like. In the present embodiment, the generation and interpolation of the application distribution and sample shot extraction processing to be described below are performed by the main control unit 40 but may be performed by the server 53 instead of the main control unit 40. The server 53 can reflect the processing result on the console control unit 46 via the communication network 62 such that the main control unit 40 drive-controls the control units 41, 42, 43, 44, and 45. Also, the generation and interpolation of the application distribution may be performed by the main control unit 40, and sample shot extraction processing may be performed by the console control unit 46.

In response to the contents of a processing request from the operation unit 50, the main control unit 40 makes a processing request (drive control) to the mold chuck position control unit 41, the substrate stage position control unit 42, the dispenser control unit 43, the helium gas ejection control unit 44, and the light source control unit 45. Note that a program relating to imprinting processing according to the present invention is stored in the server 53, and shot information for each of a plurality of shots and the application distribution for each shot (to be described below) employ a storage region such as a hard disk or the like provided in the server 53.

FIGS. 2A to 2E are explanatory diagrams illustrating the relationship between a mold pattern 21 of the mold 20 and an application distribution of an uncured resin material 31 to be applied to the substrate 30. FIG. 2A is a plan view of the mold 20, FIG. 2B is a cross-sectional view taken along the line B-B of FIG. 2A, and FIG. 2C is a plan view of one shot for the substrate 30. FIG. 2D is a cross-sectional view taken along the line D-D of FIG. 2C, and FIG. 2E is a schematic explanatory diagram illustrating the formation of the application pattern 32 by the mold 20. The groove-like mold pattern 21 provided in the mold 20 is a pattern (mold or template) that corresponds to a negative/positive inverted image of a resin pattern to be finally transferred to the substrate 30. The mold 20 is moved toward the substrate 30, and thus the uncured resin material 31 applied to the substrate 30 is pressed against the mold 20. Consequently, the uncured resin material 31 is filled in the groove-like mold pattern 21 provided in the mold 20 to thereby form the application pattern. In practice, the light source 19 irradiates the substrate 30 with ultraviolet light while the mold 20 is pressed against the substrate 30 to cure the application pattern 32. Then, the mold 20 is released from the substrate 30, whereby a resin pattern generally matching the shape of the mold pattern 21 is formed on the substrate 30. Here, in the present embodiment, the mold 20 of FIG. 2A is composed of four chip regions 22, and each of the chip regions 22 is composed of a portion where the rectangular mold pattern 21 is dense and a portion where the mold pattern 21 is absent. The application pattern 32 distribution shown in FIG. 2C is composed of four chip regions 33 to correspond to the mold 20 shown in FIG. 2A. Also, the uncured resin material 31 of which the amount corresponds to the depth of the grooves of the mold pattern 21 is applied to a region corresponding to a plurality of rectangular mold patterns 21 arranged on each of the chip regions 33. Also, the cross-sectional view shown in FIG. 2D shows that the uncured resin material 31 is applied to the substrate 30 such that the amount of the uncured resin material 31 corresponds to the depth of the grooves of the mold pattern 21. Thus, the application distribution of the uncured resin material 31 to be applied to the substrate 30 needs to be changed depending on the pattern of the mold pattern 21. Also, a thin film made of the uncured resin material 31 is formed on the substrate 30 even at portions not opposing to the grooves of the mold pattern 21. The thin film 34 is intentionally generated by the imprinting apparatus 10 for the purpose of preventing the mold 20 from being damaged by abrasion due to the direct contact between the mold 20 and the substrate 30. Thus, even in the plane of the mold 20, the application amount of the uncured resin material 31 may differ from place to place due to coarse density of the mold pattern 21.

FIGS. 3A to 3C show examples how the uncured resin material 31 applied to the substrate 30 changes due to the influence of the surrounding environment of the interior of the imprinting apparatus 10. FIG. 3A shows the state of the application distribution in one shot region immediately after the uncured resin material 31 is applied to the substrate 30 by the dispenser control unit 43. FIG. 3B shows the state of the uncured resin material 31 immediately before the mold 20 is pressed against the uncured resin material 31 shown in FIG. 2E. Here, during the time from the application of the uncured resin material 31 to the press of the mold 20, the time during which the substrate 30 is downwardly moved from the dispenser 17 to the mold 20 is generated. For this reason, the uncured resin material 31 is exposed to the environment in the imprinting apparatus 10 in the liquid state. Consequently, a part of the uncured resin material 31 may be vaporized, and thus a state change such as a reduction in the volume of the uncured resin material 31 may occur. In FIG. 3B, helium gas is sprayed on the uncured resin material 31 for the purpose of rapidly filling the uncured resin material 31 in the mold pattern 21. Hence, due to the influence of helium gas, the uncured resin material 31 applied on a resin evaporation region (for example, E1) that is positioned on the upstream side of the air flow direction of helium gas to be ejected from the helium gas injection unit 18 evaporates more rapidly than that applied on another region. Consequently, the amount of the remaining uncured resin material 31 decreases. Also, as shown in FIG. 3C, the peripheral shot for the substrate 30 may be strongly affected by an environmental change in the vicinity of a boundary of the substrate 30, such as the turbulence of the air flow generated upon driving of the substrate 30, or the like. For this reason, a state change in the uncured resin material 31 may occur in the shot arranged around the periphery of the substrate 30 that is greater than the shot arranged around the center of the substrate 30. Here, in the resin evaporation region (for example, E2) around the periphery of the substrate 30, a state change such as a large amount of evaporation of the uncured resin material 31 or the like occurs. If the imprinting of the mold 20 is performed in a state in which the uncured resin material 31 has changed, this causes a variation in the resin pattern to be formed on the substrate 30 and the height of the thin film 34.

Figure 2:
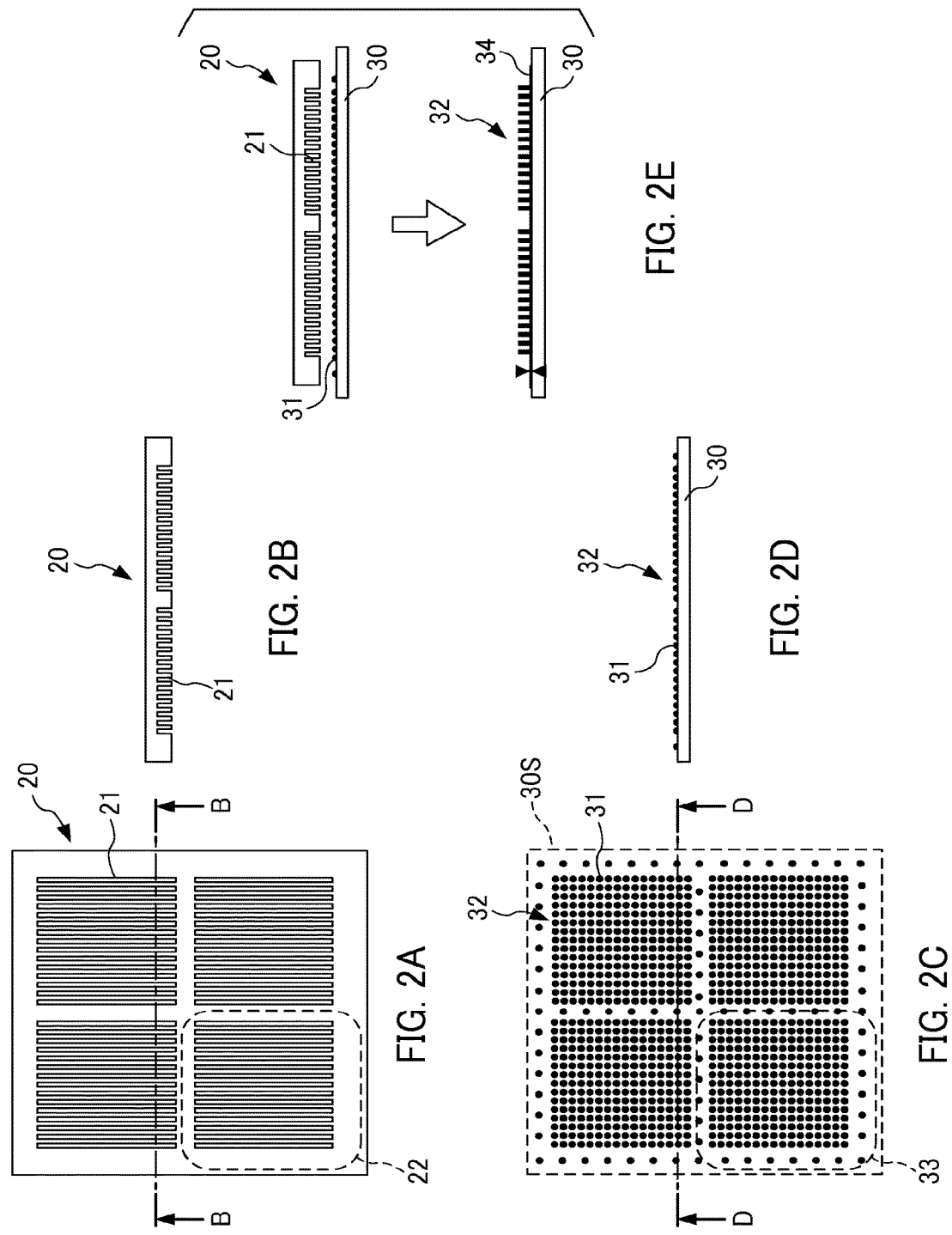
FIGS. 2A to 2E are explanatory diagrams illustrating the relationship between a mold pattern and an application pattern.
Figure 3:
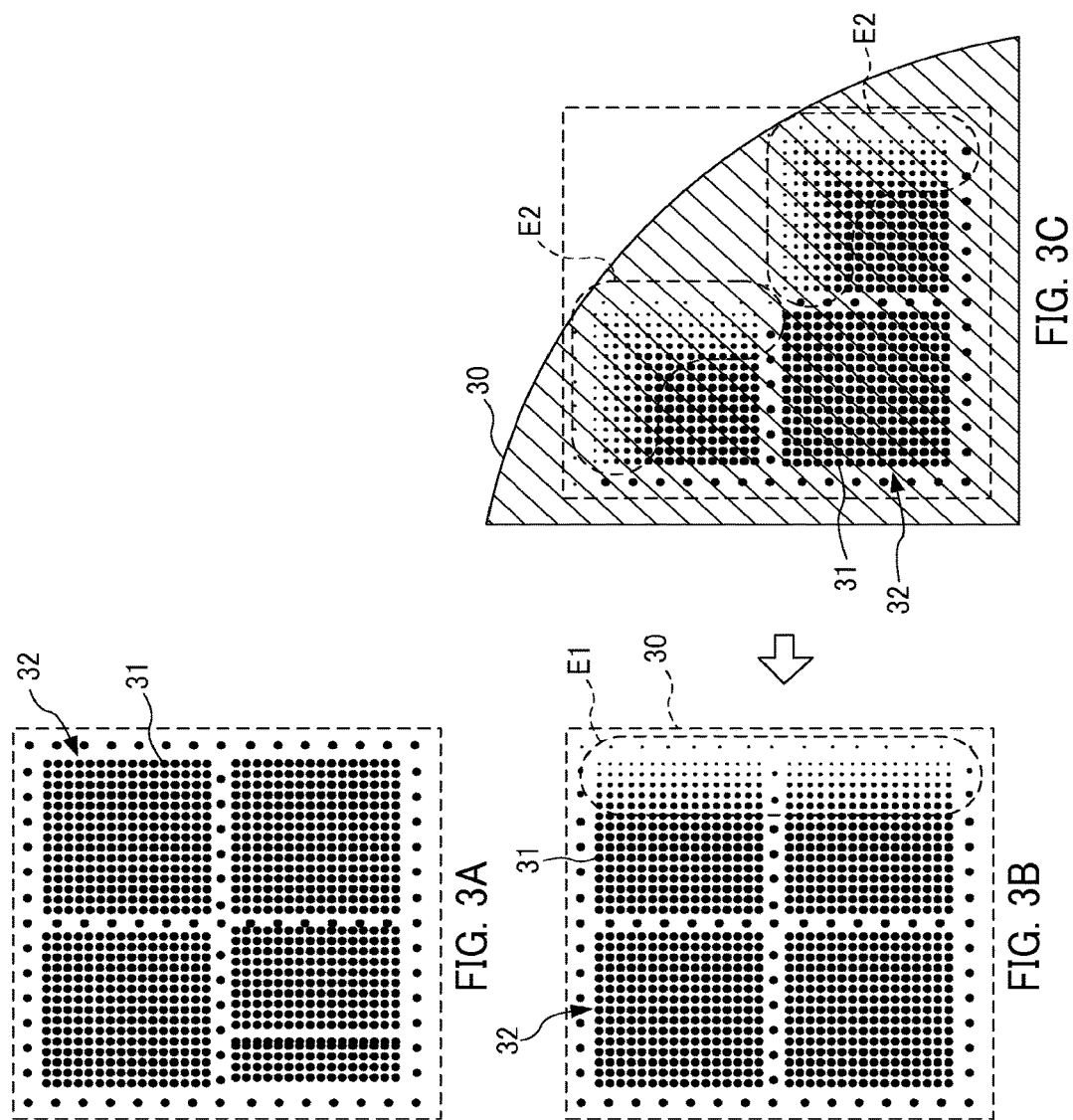
FIGS. 3A to 3C are explanatory diagrams illustrating how an uncured resin material changes.

As shown in FIGS. 2 and 3, the imprinting apparatus of the present invention generates the application distribution in consideration of the state change in the uncured resin material 31 due to the mold pattern 21 formed on the mold 20 and environmental factors such as the relative distance between peripheral equipment, including the surrounding environment, and the uncured resin material 31, and the like. In other words, the application distribution corresponding to the mold pattern 21 differs for each shot due to the difference in the environmental factors in the interior of the imprinting apparatus 10, such as the difference between mold patterns 21, the air flow direction of helium gas to be ejected from the helium gas injection unit 18, and the like. Thus, the application distribution of the uncured resin material 31 is generated for each shot in consideration of the difference in these environmental factors. In addition, when a plurality of substrates 30 is processed, the interpolation of the application distribution is performed each time the substrate 20 is processed.

Figure 4:
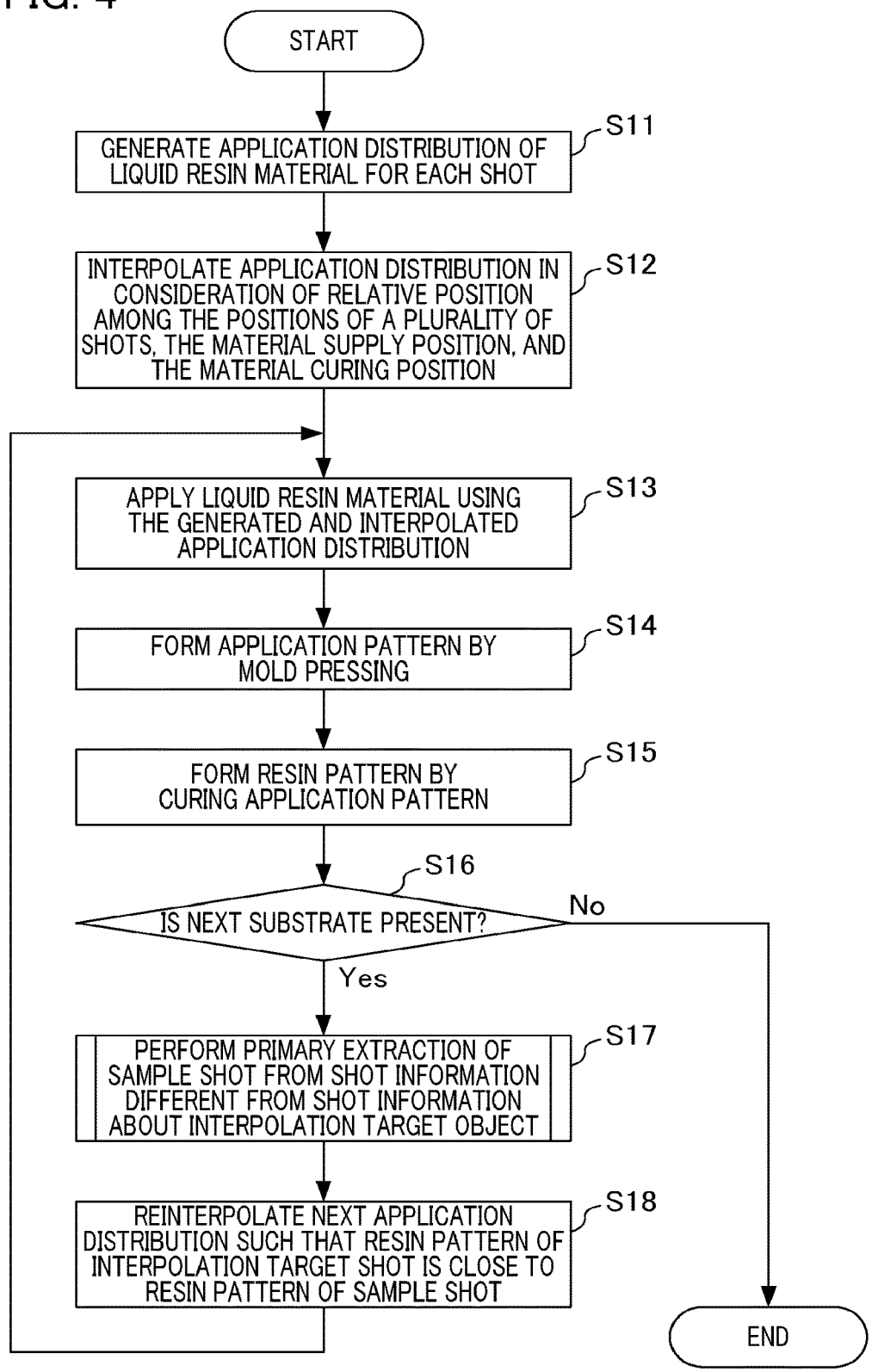
FIG. 4 is a flowchart illustrating the main routine of an imprinting apparatus.

FIG. 4 is a flowchart illustrating the main routine of the imprinting apparatus 10 of the present invention. In step S11 shown in FIG. 4, the main control unit 40 performs application distribution generation processing for generating the application distribution, i.e., the base (reference) of the uncured resin material 31 for each shot of a plurality of shots arranged on the substrate 30, and the process advances to step S12. At this time, the main control unit 40 generates an application distribution in consideration of a processing request (drive control) to be made to the control units 41, 42, 43, 44, and 45, and the surrounding environment, such as air flow or the like, produced inside the imprinting apparatus 10.

In step S12, the main control unit 40 performs interpolation control processing in consideration of the positions of a plurality of shots to the substrate 30 and the environmental factors, and the process advances to step S13. More specifically, the main control unit 40 interpolates the application distribution of the uncured resin material 31 by using shot layout information, which takes into account the relative position between the positions of a plurality of shots to the substrate 30 and the supply position of the uncured resin material 31 to be supplied from the dispenser 17, as variables. Also, the main control unit 40 interpolates the application distribution of the uncured resin material 31 by using shot layout information, which takes into account the relative position between the positions of a plurality of shots to the substrate 30 and the curing position of the uncured resin material 31 to be cured by ultraviolet light irradiated from the light source 19, as variables. Furthermore, the main control unit 40 interpolates the application distribution of the uncured resin material 31 by using shot layout information, which takes into account the relative position between the positions of a plurality of shots to the substrate 30 and the position of helium gas to be ejected from the helium gas injection unit 18, as variables.

In step S13, the main control unit 40 performs uncured resin material supply processing for applying the uncured resin material 31 to the substrate 30 for each of a plurality of shots using the generated and interpolated application distribution, and the process advances to step S14. More specifically, the main control unit 40 controls the mold chuck position control unit 41 and the substrate stage position control unit 42 to thereby change the height position and the horizontal position between the dispenser 17 and the substrate 30. Also, the main control unit 40 applies the uncured resin material 31 to each shot for the substrate 30 in response to the generated and interpolated application distribution while changing the position in the top-bottom and left-right directions between the dispenser 17 and the substrate 30. Furthermore, the main control unit 40 controls a helium gas ejection control unit 55 to dissolve helium gas into the uncured resin material 31. Note that the position in the horizontal direction between the dispenser 17 and the substrate 30 may be changed by moving only the substrate stage 15 in a horizontal plane by driving the substrate chuck 16. Also, the position in the horizontal direction between the dispenser 17 and the substrate 30 may be changed by moving only the mold chuck 13 in a horizontal plane by driving the mold driving unit 14. Furthermore, the position in the horizontal direction between the dispenser 17 and the substrate 30 may be changed by moving both the substrate stage 15 and the mold chuck 13 in the horizontal plane.

In step S14, the main control unit 40 performs application pattern forming processing for forming a predetermined application pattern from the uncured resin material 31 applied on the substrate 30, and the process advances to step S15. More specifically, the main control unit 40 brings the mold 20 into close proximity to the substrate 30 by driving the mold chuck 13, and application patterns by filling the substrate 30 with the uncured resin material 31 applied to the mold pattern 21. In step S15, the main control unit 40 performs resin pattern forming processing for forming a resin pattern by curing the application pattern applied and patterned on the substrate 30, and the process advances to step S16. More specifically, the main control unit 40 controls the light source control unit 45 in the state where the mold 20 is brought into close contact with the substrate 30, and causes the light source control unit 45 to emit ultraviolet light from the light source 19. Since a photocurable resin is employed for the uncured resin material 31, the uncured resin material 31 is cured by the ultraviolet light emitted from the light source 19. A method for curing the uncured resin material 31 includes not only a photo-curing method described above but also a heat-curing method. At this time, a thermosetting resin is used for the uncured resin material 31, and a heating source such as a halogen lamp or the like is used for a light source 51. A coil heater or the like may also be used instead of the light source 51.

In step S16, the main control unit 40 performs determination processing for determining whether or not the next substrate 30 to be processed is present on a substrate conveyance system (not shown). More specifically, when the main control unit 40 determines that the next substrate 30 to be processed is present on a substrate conveyance system, the process advances to step S17. On the other hand, when the next substrate 30 to be processed is absent on the substrate conveyance system, the routine is ended. Even when the main control unit 40 determines that the next substrate 30 to be processed has a different size and application distribution from those of the previously-processed substrate 30, the routine is ended.

In step S17, the main control unit 40 performs sample shot extraction processing in order to improve the accuracy of a resin pattern on the next substrate 30 to be processed and to further interpolate the application distribution that has been interpolated in step S12, and the process advances to step S18. More specifically, the main control unit 40 stores the generated and interpolated application distribution in steps S11 and S12 as shot information relating to a resin pattern for each of a plurality of shots in the storage region of the server 53. Also, the main control unit 40 extracts a shot including shot information, which is different from shot information about an interpolation target shot that has been specified (or extracted) from the plurality of shots and is required for interpolation, as a sample shot. In other words, as described above, the application distribution around the center of the substrate 30 is significantly different from that around the periphery thereof. Also, the application distribution of a shot around the center of the substrate 30 approximates each shot, whereas the application distribution of a shot around the periphery of the substrate 30 may frequently differ for each shot. Therefore, a shot around the center of the substrate 30 is extracted as a sample shot, and a shot around the periphery of the substrate 30, which has a different resin pattern from that of a sample shot, is specified (or extracted) as an interpolation target shot to thereby reinterpolate the application distribution of the interpolation target shot. The specific extraction routine of a sample shot will be described below.

In step S18, the main control unit 40 performs reinterpolation processing for reinterpolating the application distribution to be used for the next substrate 30 to be processed such that the resin pattern of the interpolation target shot is close to the resin pattern of the extracted sample shot. After the reinterpolation processing is performed, the process loops to step S13 and the main control unit 40 executes processing for the next substrate 30. More specifically, the main control unit 40 compares shot information about the interpolation target shot specified (or extracted) in step S17 with shot information about the extracted sample shot. As a result, the main control unit 40 determines that the portion at which shot information about the interpolation target shot is different from shot information about the sample shot is a defective portion of the resin pattern, and interpolates the application distribution so as to modify the defective portion. By performing reinterpolation, variations, such as the height direction of the resin pattern, formed on the substrate 30 can be suppressed with respect to the next substrate 30 to be processed, whereby the quality of the substrate 30 can be improved for each processing.

Figure 5:
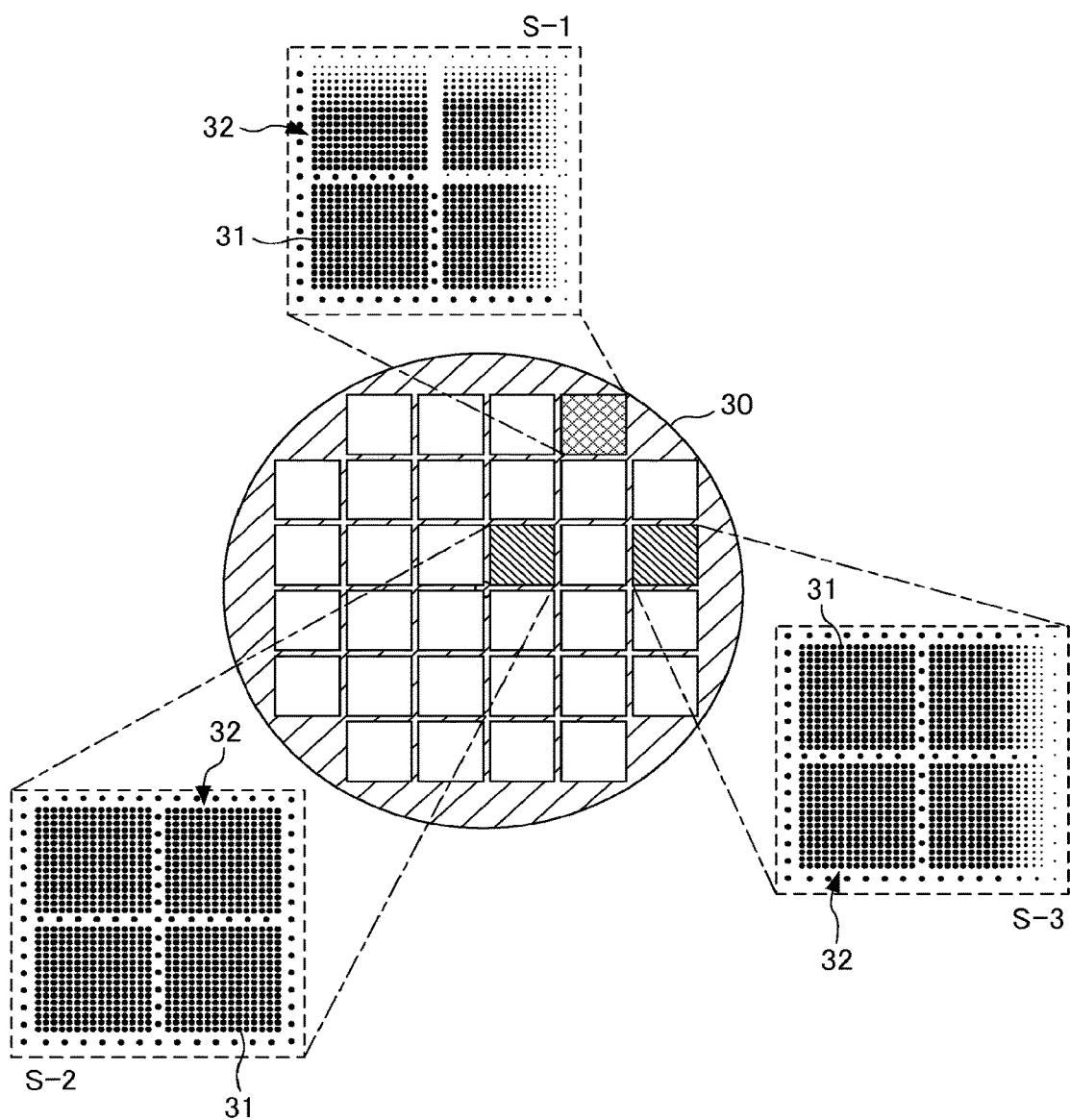
FIG. 5 is an explanatory diagram illustrating an interpolation object and the specification and extraction of a sample shot.

FIG. 5 is an explanatory diagram illustrating the specification and extraction of an interpolation target shot and a sample shot in order to perform reinterpolation described above. In FIG. 5, the shot S-1 shown by the rectangular frame of the illustrated lattice pattern is a shot in which the application distribution of the uncured resin material 31 is to be reinterpolated. In addition, the shots S-2 and S-3 shown by the rectangular frame of the illustrated diagonal pattern are the sample shots that have been extracted for the use as interpolation information for (re)interpolating the application distribution of the interpolation target shot S-1. When a user specifies the interpolation target shot S-1, the main control unit 40 automatically extracts the sample shot S-2 and the sample shot S-3. This means that the presence of the base shot required for generating the application distribution of the application pattern 32, i.e., the shot not required for interpolation, can be grasped beforehand. As a result, the number of shots for interpolating the application distribution can be decreased compared to the independent generation of the application distribution for each shot for which the influence of the surrounding environment is different, whereby the workload at the step of generating the application distribution can be reduced.

Figure 6:
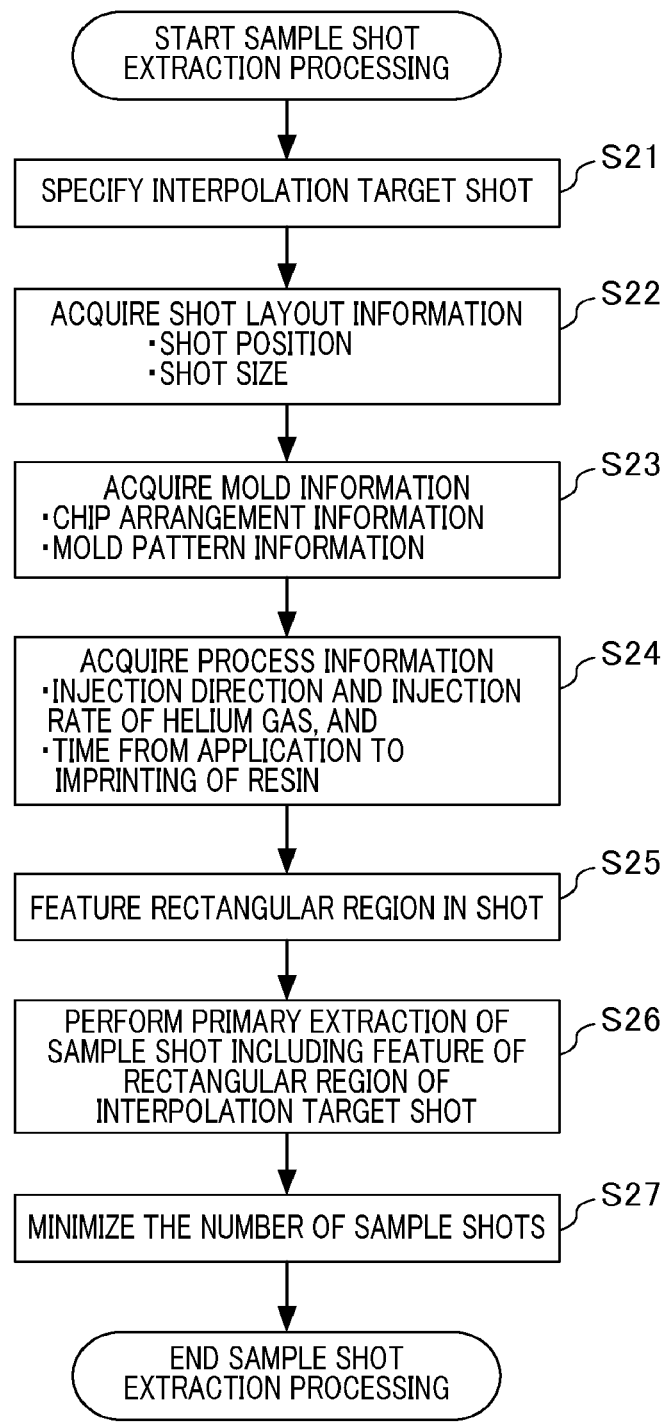
FIG. 6 is a flowchart illustrating the extraction of a sample shot.
Figure 7:
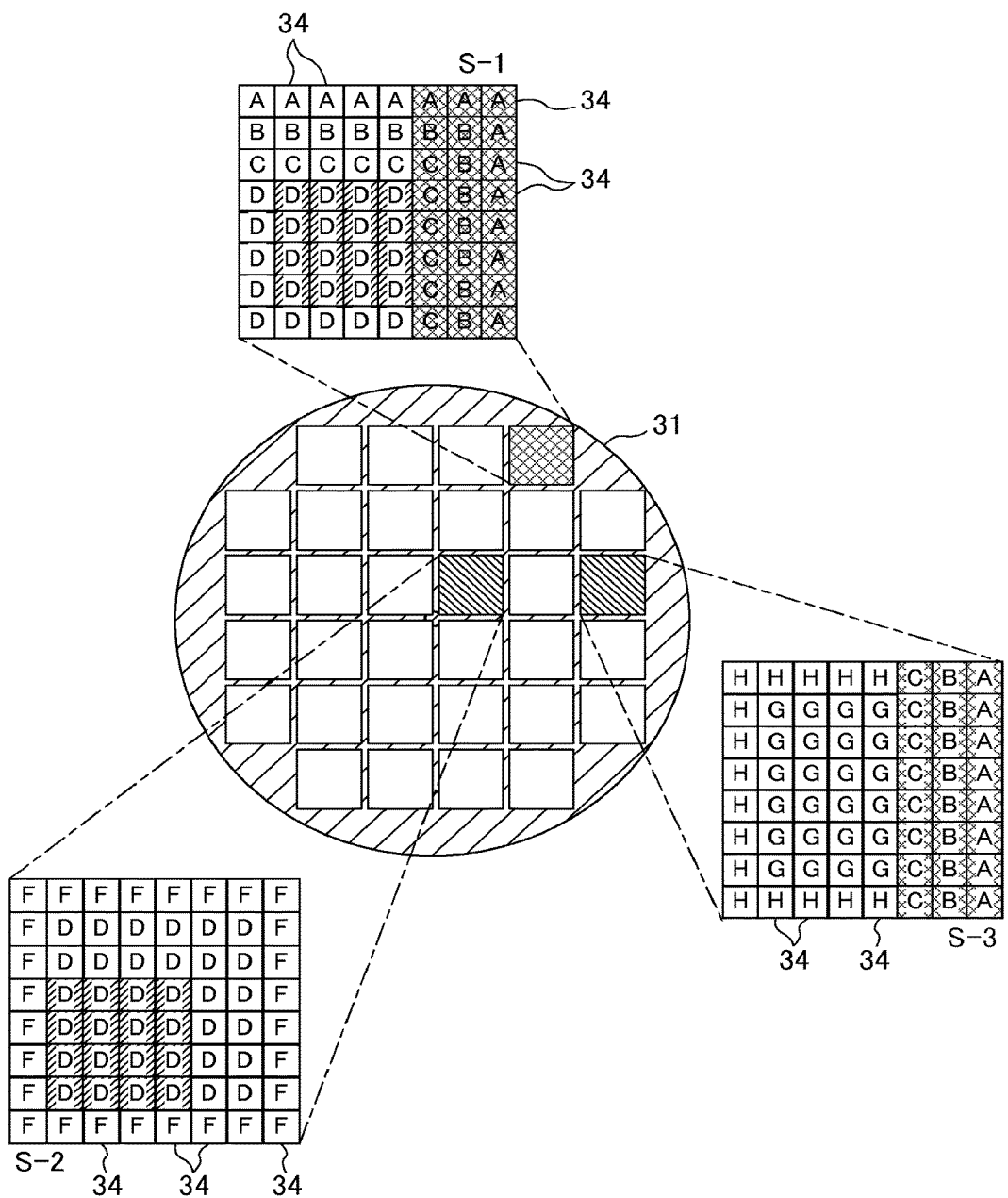
FIG. 7 is an explanatory diagram illustrating the distribution of rectangular regions in which the rectangular regions are featured.

FIG. 6 is a flowchart illustrating the extraction of the sample shots S-2 and S-3 to be used as interpolation information with respect to the interpolation target shot S-1 specified for interpolating the application distribution. FIG. 7 is an explanatory diagram illustrating the distribution of rectangular regions in which the rectangular regions are featured for each shot. In step S21, the main control unit 40 performs specification processing for specifying the interpolation target shot S-1 for interpolating the application distribution selected by a user, and the process advances to step S22. More specifically, it is desired that a shot arranged at the periphery of the substrate 30, in particular, a shot of which two sides, the upper side and the right side, of a rectangular frame-like shot are facing towards the periphery of the substrate 30, be the interpolation target shot S-1 immediately after the start of reinterpolation processing or the like. Also, the main control unit 40 displays the substrate 30 and the shot shown in FIG. 5 on the monitor 52 (does not display the shots S-1, S-2, and S-3 on an enlarged-scale) such that a user selects the interpolation target shot S-1 using the operation unit 50.

In step S22, the main control unit 40 performs layout information acquisition processing for acquiring shot layout information about all shots arranged on the substrate 30, and the process advances to step S23. More specifically, the main control unit 40 acquires shot layout information such as shot position, shot size, and the like for each shot. At this time, the main control unit 40 defines the center and orientation of the substrate 30 for the movement of the substrate 30 by the substrate stage 15. In general, a convex or concave reference is provided around a part of the periphery of the substrate 30, and thus a shot position is identified based on the reference.

In step S23, the main control unit 40 performs mold information acquisition processing for acquiring mold information about the mold 20 arranged opposing the substrate 30, and the process advances to step S24. More specifically, the main control unit 40 acquires the placement information about a chip to be formed on the mold 20 and the type of pattern for each chip as the mold information about the mold 20. In step S24, the main control unit 40 performs process information acquisition processing for acquiring process information about the substrate 30 serving as an interpolation object (next processing), and the process advances to step S25. More specifically, examples of process information include the injection direction and the injection rate (including injection time) of helium gas to be dissolved into the uncured resin material 31 applied on the substrate 30, a predetermined time after the uncured resin material 31 is applied on the substrate 30 until the mold 20 is pressed thereagainst, and the like. Generally, process information is often common to each of the shots for the substrate 30. However, even when process information is different for each shot, the main control unit 40 distinguishes the difference between shots, and acquires process information. Although information acquired in steps S22 to S24 is stored in the storage region of the server 53 for each shot in the table configuration, it is preferable that information be stored in rectangular region units to be described below.

In step S25, the main control unit 40 carries out feature definition processing in which features are applies to all shots arranged on the substrate 30, and the process advances to step S26. More specifically, the main control unit 40 resolves a shot into several rectangular regions 34 as shown in the interpolation target shot S-1 of FIG. 7, and applies features to each of the resolved rectangular regions 34. In the present embodiment, the shot area of the interpolation target shot S-1 is divided into eight segments in both the vertical direction and the horizontal direction, and is divided into sixty four rectangular regions 34 in total. Therefore, the main control unit 40 applies features to each of the divided rectangular regions 34 based on shot layout information, mold information, and process information that have been acquired in steps S22 to S24. In applying the features, the ranking, such as normal ranking, interpolation unnecessary ranking, and interpolation necessary ranking, is stepwisely set to the formed resin patterns, and the ranking is determined for each rectangular region 34. The ranking is defined as a further finely-segmented feature.

In step S26, the main control unit 40 performs sample shot primary extraction processing for primary extraction of a shot including features of the rectangular regions 34 of the interpolation target shot S-1 that is the extraction target of the sample shots S-2 and S-3, and the process advances to step S27.

FIG. 8 is a table illustrating how features are applied to the rectangular regions 34. The feature is determined by the combinations of a plurality of feature elements. Feature elements include, for example, the pattern type of the mold 20 to be pressed against the rectangular regions 34, the flow rate of helium gas, which has been calculated based on the injection position and the injection rate of helium gas, in each of the rectangular regions 34, the distance from the boundary to the rectangular region 34 of the substrate 30, and the like. At this time, the type of the feature elements can be changed as required. Also, a semantic value may be set on the value of the feature elements. For example, even when the distance from the actual injection port of helium gas to each of the rectangular regions 34, which are distant to the injection port of helium gas, is different, the state change in the uncured resin material 31 imparted by helium gas may be treated in an identical fashion. In such a case, the helium gas flow rate, which is one of the feature elements, is set to an identical value. As described above, a combination of several feature elements is defined as "feature", those having different feature elements are identified by the main control unit 40 as different features. Thus, in step S25, the main control unit 40 further divides all shots for the substrate 30 into the rectangular regions 34, and imparts a feature for each rectangular region 34 in accordance with the table shown in FIG. 8. Although the feature element shown in FIG. 8 is classified into eight segments, the number of segments is arbitrary. Then, for example, the ranking is defined such that feature A to feature C are classified as the interpolation necessary ranking since they correspond to the resin evaporation region E1 or E2 shown in FIG. 3, feature D to feature F are classified as the interpolation unnecessary ranking, and features G and H are classified as the normal ranking. The more the number of rectangular regions 34 that correspond to the features A to C, the more interpolation is required. Hence, in step S26, the feature A to the feature H are set as the point system (for example, the feature A is set to one point, and so the feature H is set to eight points), and a shot being equal to or greater than a predetermined point may be subject to primary extraction as a sample shot. In the present embodiment, primary extraction is carried out in which a shot including any one of the features A, B, C, and D of the interpolation target shot S-1 is extracted multiple times as a sample shot. At this time, if a shot including any one of the features A, B, C, and D is simply the target for extraction, numerous shots may be subject to primary extraction. Therefore, it is desirable that a shot having a larger number of rectangular regions 34 having identical feature be subject to primary extraction.

In step S27, the main control unit 40 minimizes (narrows) the number of sample shots, determines the final sample shots S-2 and S-3, and then the routine is ended. More specifically, the main control unit 40 compares a combination of sample shots including all of the features A, B, C, and D of the rectangular regions 34 of the shot S-1 from a plurality of sample shots subject to primary extraction in step S26, and extracts a shot having a smaller number of rectangular regions 34 having the identical feature. The extracted shots finally become the sample shots S-2 and S-3. In other words, a shot having the identical feature arrangement may be a shot required for interpolation, such as a shot diagonally opposite the interpolation target shot S-1. Also, a shot may be a normal-ranked shot that is difficult for interpolating into the application distribution to be matched as the resin pattern due to the edge rounding of the substrate 30 or the like. Thus, a possible sample shot is selected by excluding a shot having the identical feature arrangement. After a shot having a larger number of rectangular regions 34 having the identical feature is subject to primary extraction, a shot having the height number and position of the identical feature may be finally determined as the sample shot S-2 or S-3 as shown in FIG. 7.

Figure 9:
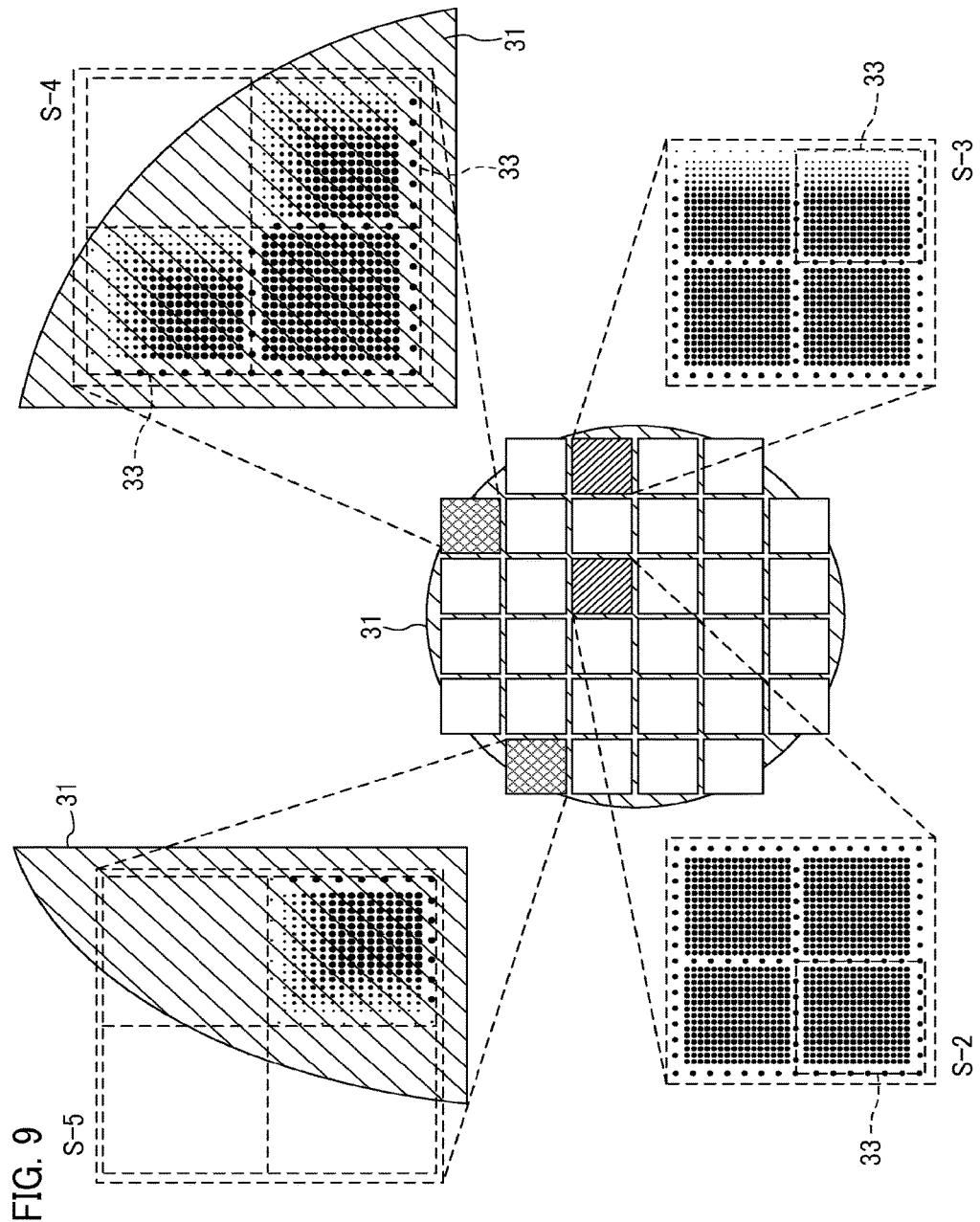
FIG. 9 is a schematic diagram illustrating the state in which sample shot extraction is applied to a peripheral shot.

FIG. 9 is a schematic explanatory diagram illustrating the state in which sample shot extraction is applied to a peripheral shot for the substrate 30. The interpolation target shot S-1 and the sample shot S-2 described above are the shots arranged inside the peripheral edges of the substrate 30. However, the shots including the chip region 33 that protrudes beyond the substrate 30 may be the interpolation target shots S-4 and S-5. The sample shots S-2 and S-3 may be determined by utilizing these interpolation target shots S-4 and S-5. At this time, in the featuring of the rectangular region 34 in step S25, a value indicating that the rectangular region 34 is not included in the substrate 30 in terms of "a distance from the periphery of the substrate" among the feature elements shown in the table of FIG. 8 is separately set. With this arrangement, the sample shots S-2 and S-3 can be extracted by utilizing the sample shot extraction routine shown in FIG. 6. Also, since the chip region 33 of each of the interpolation target shots S-4 and S-5 is partially valid, it is desired that a feature upon determination of the sample shots S-2 and S-3 be determined in the corresponding chip region 33. Note that the interpolation target shots S-4 and S-5 are not intended to be specified simultaneously.

As described above, in the present embodiment, a sample shot to be used for the calculation of the application distribution of the uncured resin material 31 can be extracted automatically before the next substrate 30 is processed. With this arrangement, the number of shots for interpolating the application distribution can be decreased compared to the independent generation and interpolation of the application distribution for each shot for which the influence of the surrounding environment is different, whereby the workload at the step of generating the application distribution can be reduced. Also, when the interpolation target shot S-1, which is assumed to be required for reinterpolation, is selected, the sample shots S-2 and S-3 that are suitable for interpolating the interpolation target shot S-1 can be extracted to thereby interpolate the application distribution to approach the sample shots S-2 and S-3. Specifically, the sample shot extraction routine shown in FIG. 6 can be not only performed by the main control unit 40 or the console control unit 46 included in the imprinting apparatus 10 body, but also executed by the operation unit 50 provided with the server 53. Thus, sample shot extraction may be performed by an external calculator such as a product-checking computer or the like after resin pattern formation, and the extraction result may be reflected to the console control unit 46 via the communication network 62 to thereby interpolate the application distribution using the main control unit 40.

Second Embodiment

Figure 10:
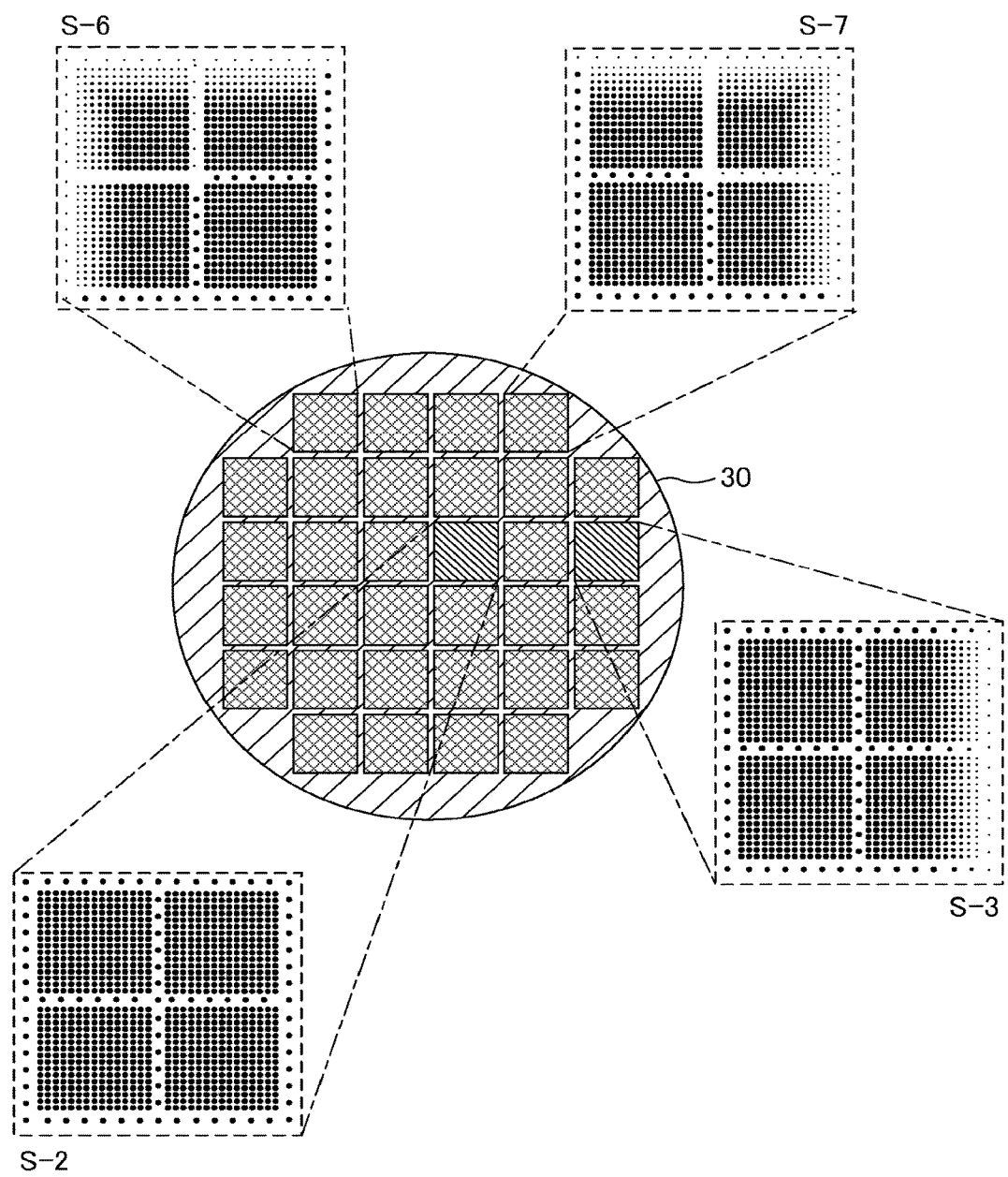
FIG. 10 is an explanatory diagram illustrating sample shot extraction according to a second embodiment.

FIG. 10 shows a second embodiment of the imprinting apparatus 10 of the present invention, and is an explanatory diagram illustrating sample shot extraction for all shots for the substrate 30. In the first embodiment, in step S21 shown in FIG. 6, a user specifies the interpolation target shot S-1 for extracting the sample shots S-2 and S-3. However, the present invention performs reinterpolation each time the substrate 30 is processed, which makes it difficult for a user to determine that which shot is the next interpolation target shot. Hence, in the second embodiment, when a sample shot for interpolating the application distribution of the interpolation target shot is extracted, the interpolation target shot is not specified but automatically extracted.

FIG. 10 shows the extraction of the sample shots S-3 and S-4 as a result of sample shot extraction for all shots. At this time, the application distribution of the uncured resin material 31 for all shots other than the sample shots S-2 and S-3 can be interpolated, provided that the application distribution of the uncured resin material 31 for the sample shots S-2 and S-3 is set as a predetermined condition. The interpolation target shots S-6 and S-7 are formed by the application distribution that has been generated based on the application distribution of the sample shots S-2 and S-3. For example, in the case of the interpolation target shot S-6, the application distribution of the area near the right side of the sample shot S-3 in the vicinity of the periphery of the substrate 30 is employed for the area near the illustrated upper side and the area near the left side in the vicinity of the periphery of the substrate 30. In the interpolation target shot S-6, the application distribution of the sample shot S-2 located near the center of the substrate 30 is employed for the area near the lower right side near the center of the substrate 30. With this arrangement, the resin pattern of the interpolation target shot S-6 can be closer to the resin pattern of the sample shots S-2 and S-3. In the case of the interpolation target shot S-6, the application distribution near the illustrated upper side in the vicinity of the periphery of the substrate 30 can be adapted to data, which is generated by rotating the application distribution near the illustrated right side of the sample shot S-3 by 90 degrees counterclockwise, by the main control unit 40. Likewise, in the case of the interpolation target shot S-6, the application distribution near the illustrated left side in the vicinity of the periphery of the substrate 30 can be adapted to data, which is generated by rotating the application distribution near the illustrated right side of the sample shot S-3 by 180 degrees counterclockwise, by the main control unit 40. Furthermore, the application distribution of a portion at which the application distributions near the illustrated upper side and left side in the vicinity of the periphery of the substrate 30 intersect with each other employs one of the data rotated by 90 degrees or 180 degrees as described above.

Figure 11:
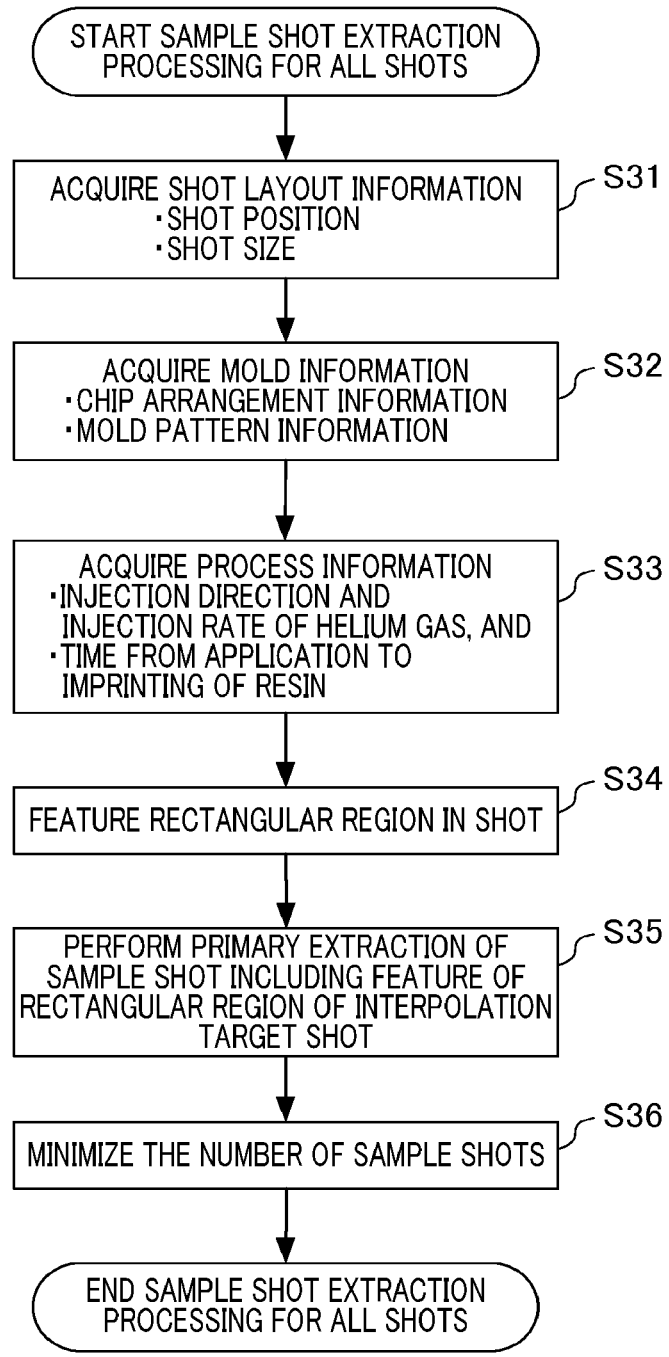
FIG. 11 is a flowchart illustrating sample shot extraction processing.

FIG. 11 is a flowchart illustrating a sample shot extraction operation routine for all shots for the substrate 30. The difference between the routine shown in FIG. 11 and the extraction routine of the first embodiment shown in FIG. 6 is that the rectangular regions 34 for extracting the sample shots S-2 and S-3 are limited to the rectangular regions 34 included in the specified interpolation target shot S-1 or are the rectangular regions 34 included in all shots.

More specifically, processing for specifying the extraction target for the sample shots S-2 and S-3 as described in step S21 is not included. In other words, in step S31, the main control unit 40 acquires shot layout information about all shots for the substrate 30 in the same manner as step S22. In step S32, the main control unit 40 acquires mold information about the mold 20 in the same manner as step S23. In step S33, the main control unit 40 acquires process information about the substrate 30 in the same manner as step S24. In step S34, the main control unit 40 divides all shots arranged on the substrate 30 into a plurality of rectangular regions 34, and features each of the rectangular regions 34 in the same manner as step S25.

In step S36, the main control unit 40 performs sample shot primary extraction processing for the primary extraction of a sample shot including features of the rectangular regions 34 of the interpolation target shot S-1 in the same manner as step S26, and the process advances to step S37. In step S26, a shot including a feature of the rectangular region 34 of the interpolation target shot S-1 is extracted. On the other hand, in step S36, the sample shots S-2 and S-3 are extracted by setting all shots as candidates. In other words, a shot including all of the features included in the rectangular regions 34 of all shots is extracted. More specifically, the interpolation target shot S-1 specified in step S26 includes the features A, B, C, and D as shown in FIG. 7. In step S26, the sample shot S-2 including the feature D of the interpolation target shot S-1 and the sample shot S-3 including the features A, B, and C of the interpolation target shot S-1 are extracted. In contrast, in step S36, a sample shot including all of the features A, B, C, and D of the interpolation target shot S-1 is subject to primary extraction.

In step S37, the main control unit 40 performs sample shot extraction processing for reducing the number of shots from the sample shots subject to primary extraction in step S36 to the final sample shots in the same manner as step S27, and then the routine is ended. More specifically, from a plurality of sample shots extracted in step S36, a group having the smallest number of sample shots is extracted from the combinations of the sample shots including all of the features of the rectangular regions 34 of all shots. Then, the extracted sample shots finally become the sample shots S-2 and S-3.

The aforementioned routine relates to a sample shot extraction. However, in the extraction of the interpolation target shots S-6 and S-7 in the second embodiment, the featuring processing as the featuring routine of the rectangular region 34 in step S36 is performed immediately before step S31. In other words, the main control unit 40 performs interpolation target shot specification processing for specifying shots having the largest number of the rectangular regions 34, i.e., the interpolation target shots S-6 and S-7, among shots having a different segment of the features of the rectangular regions 34 of all shots. With this arrangement, a shot having the lowest rank can be extracted with priority as the interpolation target shot. It is contemplated that the resin pattern of the interpolation target shots S-6 and S-7 after interpolation has a higher accuracy than the resin pattern of the shot for the previously-processed substrate 30. Thus, when the next substrate 30 is processed, a different shot from the previous interpolation object shot is extracted as the interpolation target shot.

As described above, in the second embodiment, a shot used for calculating the application distribution information to the uncured resin material 31 for all shots arranged on the substrate 30 can be extracted in advance. With this arrangement, the number of shots for generating the application distribution can be decreased compared to the independent generation of the application distribution for each shot for which the influence of the surrounding environment is different, whereby the workload at the step of generating the application distribution can be reduced.

Figure 12:
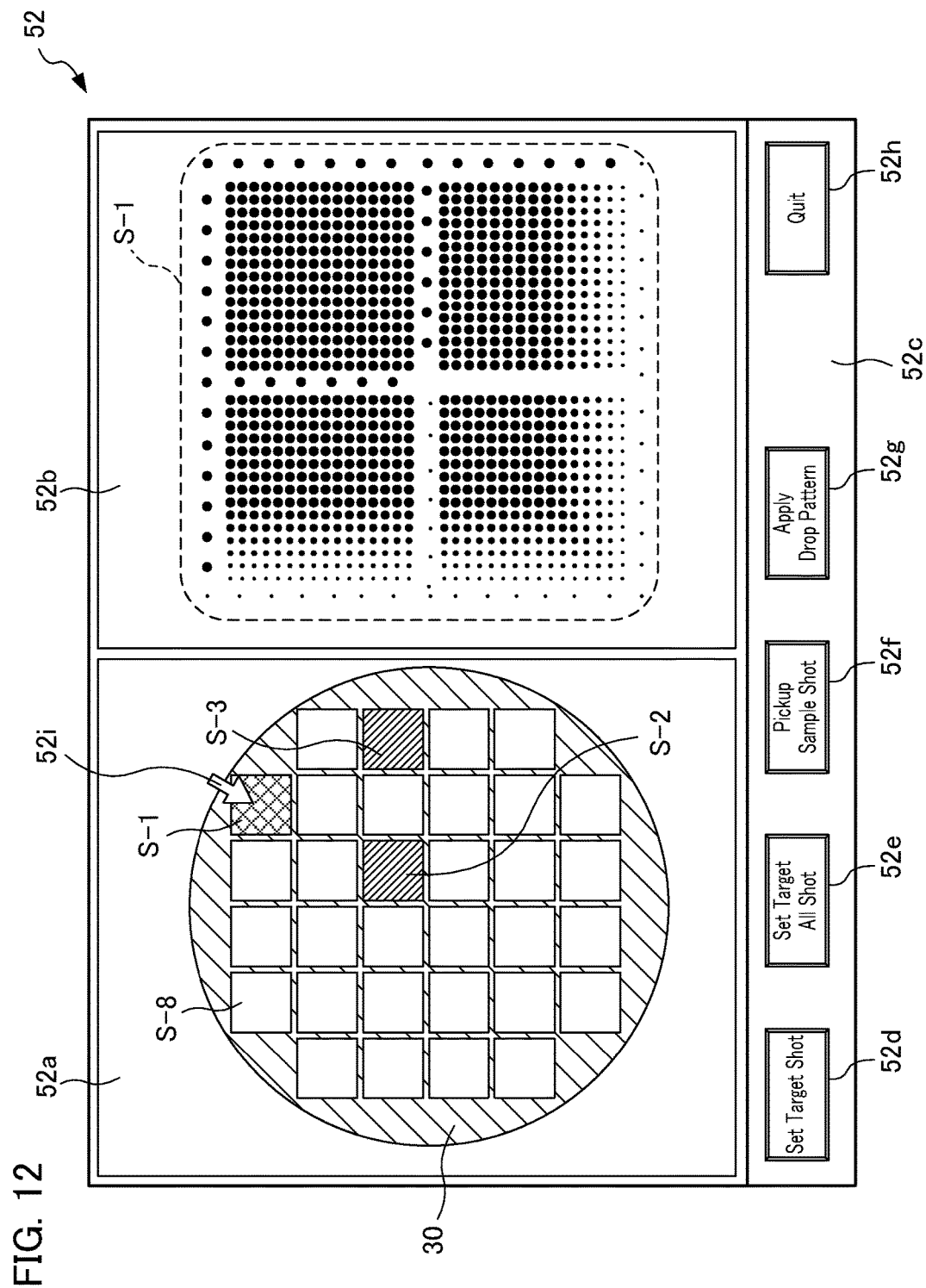
FIG. 12 is an explanatory diagram illustrating an example of a screen to be displayed on a monitor.

FIG. 12 is an explanatory diagram illustrating a selection screen for the interpolation target shot S-1 and an extraction screen for the sample shots S-2 and S-3, both of which are to be displayed on the monitor 52. The screen on the monitor 52 is divided into the right and left, above and below (that is, divided into three sections), wherein an upper-left display area is a substrate display area 52a, an upper-right display area is a shot display area 52b, and a lower display area is an operation button display area 52c. The display image on each of the display areas 52a, 52b, and 52c is image data that has been generated by the console control unit 46. Here, the substrate display area 52a displays the substrate 30 and all shots. At this time, the console control unit 46 displays the interpolation target shot S-1, and the sample shots S-2 and S-3 in a different display state using a different pattern or color such that a user can distinguish these shots from the other shots. A selected shot is enlarged-displayed on the shot display area 52b. Here, the illustrated upper-left shot S-1 for the substrate 30 is displayed. At this time, the console control unit 46 displays the shot S-1 of the substrate display area 52a so as to blink such that a user can identify the fact that the shot S-1 is being displayed on the shot display area 52b. A shot command button 52d, an all shot selection button 52e, an extraction execution button 52f, a resin pattern reflection button 52g, and a screen end button 52h are displayed on an operation button display unit area 52c. The button operation for the areas 52a, 52b, and 52c is performed using the input terminal 51 (in particular, a mouse). Note that a liquid crystal touch panel may be employed for the monitor 52 so as to perform a selection operation in a direct way.

The main control unit 40 displays the image of the substrate 30 and the image of all shots, of which the arrangement and the size are aligned with those of the actual substrate 30 and the actual shot, on the substrate display area 52a. Also, when a user performs a selection operation (click operation) with a command icon 52i aligned with any shot (for example, the shot S-1), the main control unit 40 displays the selected and enlarged shot S-1 on the shot display area 52b. Furthermore, when a user performs a selection operation for another shot, the main control unit 40 switches and displays the selected shot on the shot display area 52*b*. Also, when the interpolation target shot S-1 is displayed on the shot display area 52*b*, the main control unit 40 superposes and displays the application distribution that have been interpolated based on the extracted sample shots S-2 and S-3. The main control unit 40 configures the arrangement coordinate for each grain of the uncured resin material 31 and the amount of grain thereof, and displays the calculated application distribution in a predetermined arrangement and size.

When the shot command button 52*d* is selected for operation, the main control unit 40 recognizes the shot S-1 as the interpolation target shot in association with the selection operation for the shot superimposed on the command icon 52*i*. When the all shot selection button 52*e* is selected for operation, the main control unit 40 executes the interpolation target shot automatic extraction described in the second embodiment on all shots. When the extraction execution button 52*f* is selected for operation, the main control unit 40 starts extraction processing for the sample shots with respect to the interpolation target shot S-1 that has been selected (specified) by the shot command button 52*d* or has been extracted by the all shot selection button 52*e*. When extraction processing for the sample shots has been completed, the main control unit 40 switches the display of the extracted sample shots such that the extracted sample shots S-2 and S-3 are identifiable from the shots of the substrate display area 52*a*. Also, the main control unit 40 automatically displays the extracted sample shots on the shot display area 52*b*. Furthermore, when a plurality of the sample shots is extracted, the main control unit 40 automatically displays any one of them on the shot display area 52*b*. At this time, when the priority is specified in advance such as the fact that the sample shot, of which the application distribution is the closest to that of the interpolation target shot S-1, is preferentially displayed, the main control unit 40 displays the sample shot based on the priority. When an application pattern reflection button 52*g* is selected for operation, the main control unit 40 stores the application distribution displayed on the shot display area 52*b* in the server 53. The main control unit 40 employs data of the application distribution stored in the server 53 as the application distribution for a shot to be used upon processing of the next substrate 30. When a screen end button 52*h* is selected for operation, the main control unit 40 clears the display state of the substrate display area 52*a* and the shot display area 52*b* in order to perform reinterpolation processing for the next substrate 30 to be processed. A command icon (mouse pointer) 52*i* is moved in a screen by the operation of the input terminal 51 (mouse).

As described above, sample shot extraction processing is carried out by using a graphical interface, whereby sample shot extraction processing can be intuitively carried out in a simple way, resulting in an improvement in operation efficiency.

(Article Manufacturing Method)

A method of manufacturing a device (semiconductor integrated circuit element, liquid crystal display element, and the like) as an article may include a step of forming a pattern on a substrate (wafer, glass plate, film-like substrate, or the like) using the imprint apparatus described above. Furthermore, the manufacturing method may include a step of etching the substrate on which a pattern has been formed. When other articles such as a patterned medium (storage medium), an optical element, or the like are manufactured, the manufacturing method may include another step of treating (processing) the substrate on which a pattern has been formed instead of the etching step. The article manufacturing method of this embodiment has an advantage, as compared with a conventional method, in at least one of performance, quality, productivity and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-138206 filed Jun. 17, 2010 which is hereby incorporated by reference herein in its entirety.

What is claimed is:

1. A generating device that is available to an imprinting apparatus for forming a resin pattern on each of a plurality of shots arranged on a substrate using a mold and generates an application distribution of an uncured resin for a target shot of the plurality of shots, the device comprising:
   a giving unit configured to give a feature corresponding to a volatility of the uncured resin to each of a plurality of regions into which each of the plurality of shots is divided, based on layout information of the plurality of shots;
   an extracting unit configured to extract a combination of sample shots out of the plurality of shots, such that the combination of sample shots includes all of the given features given by the giving unit to the target shot and each of the combination of sample shots is different from the target shot of the plurality of the shots; and
   a generating unit configured to generate first information about the application distribution of the uncured resin on each of the extracted plurality of sample shots extracted by the extracting unit, and then generate second information about application distribution of the uncured resin on the target shot based on the generated first information.

2. The device according to claim 1, wherein the giving unit gives the feature based on the layout information and information about a flow rate of gas to be dissolved into the uncured resin.

3. The device according to claim 1, wherein the plurality of shots are all of shots on the substrate.

4. The device according to claim 1, wherein the extracting unit extracts the combination of sample shots such that a number of sample shots is minimized.

5. The device according to claim 1, wherein the extracting unit extracts the combination of sample shots such that the combination of sample shots includes all features given to the plurality of shots by the giving unit.

6. The device according to claim 1, wherein the giving unit gives the feature to each of a plurality of regions into which each of the plurality of shots is divided, further based on flow rate of helium gas to be dissolved into the uncured resin.

7. The device according to claim 1, wherein the extracting unit extracts the combination of sample shots which includes first sample shot and second sample shot, wherein the first sample shot includes a feature which is not given to the second sample shot, and the second sample shot includes a feature which is not given to the first sample shot.

* * * * *